United States Patent
Dasgupta et al.

(10) Patent No.: US 10,408,866 B2
(45) Date of Patent: Sep. 10, 2019

(54) POWER THEFT LOCATION IDENTIFICATION IN DISTRIBUTION SYSTEMS USING VOLTAGE READING FROM SMART METERS

(71) Applicant: Utopus Insights, Inc., Valhalla, NY (US)

(72) Inventors: Kalyan Kanti Dasgupta, Bangalore (IN); Jagabondhu Hazra, Bangalore (IN); Manikandan Padmanaban, Bangalore (IN)

(73) Assignee: Utopus Insights, Inc., Valhalla, NY (US)

( * ) Notice: Subject to any disclaimer, the term of this patent is extended or adjusted under 35 U.S.C. 154(b) by 261 days.

(21) Appl. No.: 14/819,968

(22) Filed: Aug. 6, 2015

(65) Prior Publication Data

US 2017/0038415 A1   Feb. 9, 2017

(51) Int. Cl.
*G01R 22/06* (2006.01)
*G01R 19/25* (2006.01)
*G01R 31/08* (2006.01)

(52) U.S. Cl.
CPC ....... *G01R 22/066* (2013.01); *G01R 19/2513* (2013.01); *G01R 31/086* (2013.01); *Y04S 10/522* (2013.01)

(58) Field of Classification Search
None
See application file for complete search history.

(56) References Cited

U.S. PATENT DOCUMENTS

| | | | |
|---|---|---|---|
| 2008/0109387 A1* | 5/2008 | Deaver | G01R 19/16547 705/412 |
| 2012/0245869 A1 | 9/2012 | Ansari | |
| 2013/0096724 A1 | 4/2013 | Divan et al. | |
| 2013/0151026 A1 | 6/2013 | Hughes | |
| 2014/0236506 A1 | 8/2014 | Nikovski et al. | |
| 2015/0149396 A1* | 5/2015 | Arya | G06N 5/04 706/46 |
| 2015/0316620 A1* | 11/2015 | Luan | H02J 3/00 702/58 |

OTHER PUBLICATIONS

Rudran, Dileep, et al., "Achieving high performance with theft analytics", Sep. 2011, 20 pages, Accenture, available at: www.Accenture.com.

(Continued)

*Primary Examiner* — Steven B Gauthier
(74) *Attorney, Agent, or Firm* — Ahmann Kloke LLP

(57) ABSTRACT

Methods and arrangements for power theft location in an electrical grid. A contemplated method includes: utilizing at least one processor to execute computer code that performs the steps of: receiving an indication of a voltage of a plurality of nodes in the branch of the electrical distribution grid; identifying voltage differences between at least of two of the plurality of nodes over a predetermined number of days, relative to different time periods within each day, wherein the at least two of the plurality of nodes are at a known relative position in the branch of the electrical distribution grid; and evaluating the identified voltage differences to determine whether the identified voltage differences satisfy a predetermined criterion indicating no power theft. Other variants and embodiments are broadly contemplated herein.

13 Claims, 4 Drawing Sheets

(56) References Cited

OTHER PUBLICATIONS

Van Den Bergh, Frank, et al., "Electricity Theft Localization Based on Smart Metering", 21st International Conference on Electricity Distribution, Frankfurt, Germany, Jun. 6-9, 2011, 4 pages, Paper No. 1267, available at: www.cired.net.

Kadurek, P., et al., "Theft detection and smart metering practices and expectations in the Netherlands", Innovative Smart Grid Technologies Conference Europe (ISGT Europe), Gothenburg, Sweden, Oct. 11-13, 2010, 7 pages, IEEE Digital Library.

* cited by examiner

POWER THEFT LOCATION IDENTIFICATION IN DISTRIBUTION SYSTEMS USING VOLTAGE READING FROM SMART METERS

BACKGROUND

As is generally known, the theft of power or energy in a power grid, often referred to as "non-technical losses" (NTLs), can represent a significant problem in power distribution systems throughout the world. Particularly, it has been estimated that utility companies throughout the world can collectively end up losing billions of dollars per year in this manner. Identifying power theft (alternatively referred to herein as "energy theft"), and particularly its location (by way of "localizing" the theft) has thus become crucial towards mitigating the longer-term impact of such problems.

BRIEF SUMMARY

In summary, one aspect of the invention provides method of locating power theft in a branch of an electrical distribution grid, said method comprising: utilizing at least one processor to execute computer code that performs the steps of: receiving an indication of a voltage of a plurality of nodes in the branch of the electrical distribution grid; identifying voltage differences between at least of two of the plurality of the nodes over a predetermined number of days, relative to different time periods within each day, wherein the at least two of the plurality of the nodes are at a known relative position in the branch of the electrical distribution grid; and evaluating the identified voltage differences to determine whether the identified voltage differences satisfy a predetermined criterion indicating no power theft.

Another aspect of the invention providers an apparatus for locating power theft in a branch of an electrical distribution grid, said apparatus comprising: at least one processor; and a computer readable storage medium having computer readable program code embodied therewith and executable by the at least one processor, the computer readable program code comprising: computer readable program code that receives an indication of a voltage of a plurality of nodes in the branch of the electrical distribution grid; computer readable program code that identifies voltage differences between at least of two of the plurality of the nodes over a predetermined number of days, relative to different time periods within each day, wherein the at least two of the plurality of the nodes are at a known relative position in the branch of the electrical distribution grid; and computer readable program code that evaluates the identified voltage differences to determine whether the identified voltage differences satisfy a predetermined criterion indicating no power theft.

An additional aspect of the invention provides a computer program product for locating power theft in a branch of an electrical distribution grid, said computer program product comprising: a computer readable storage medium having computer readable program code embodied therewith, the computer readable program code comprising: computer readable program code that receives an indication of a voltage of a plurality of nodes in the branch of the electrical distribution grid; computer readable program code that identifies voltage differences between at least of two of the plurality of the nodes over a predetermined number of days, relative to different time periods within each day, wherein the at least two of the plurality of the nodes are at a known relative position in the branch of the electrical distribution grid; and computer readable program code that evaluates the identified voltage differences to determine whether the identified voltage differences satisfy a predetermined criterion indicating no power theft.

A further aspect of the invention provides a method comprising: receiving an indication of a voltage of a plurality of nodes in a radial electrical distribution grid; identifying voltage differences between at least of two of the plurality of the nodes over a predetermined number of consecutive days, relative to different time periods within each day, wherein the at least two of the plurality of the nodes are at a known relative position in the branch of the electrical distribution grid; calculating voltage differences between different ones of the nodes; and evaluating the identified voltage differences to determine whether the identified voltage differences satisfy a predetermined criterion indicating no power theft, wherein the predetermined criterion involves variance in a calculated equivalent load at a distribution substation in the electrical distribution grid.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
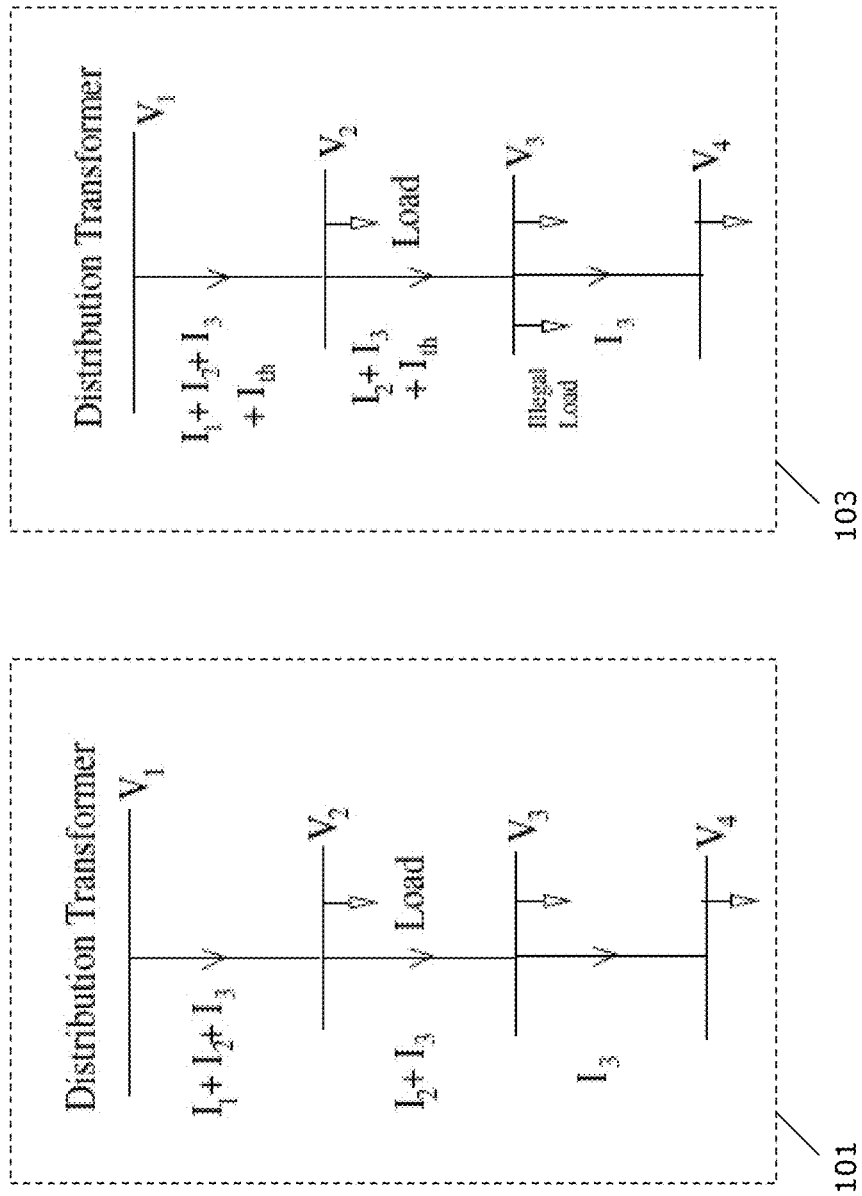
FIG. 1 schematically illustrates radial feeders under normal circumstances and in a condition of power theft.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The description now turns to the figures. The illustrated embodiments of the invention will be best understood by reference to the figures. The following description is intended only by way of example and simply illustrates certain selected exemplary embodiments of the invention as claimed herein.

Specific reference will now be made here below to FIG. 1-3. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 4. In accordance with an exemplary embodiment, most if not all of the process steps, components and outputs discussed with respect to FIGS. 1-3 can be performed or utilized by way of a processing unit or units and system memory such as those indicated, respectively, at 16' and 28' in FIG. 4, whether on a server computer, a client computer, a node computer in a distributed network, or any combination thereof.

Broadly contemplated herein, in accordance with at least one embodiment of the invention, are methods and arrangements which provide a capability for calculating voltage differences calculated from smart meter readings in a manner to locate a probable point of power theft. This can involve using solely using voltage readings, wherein the resultant theft detection system is independent of feeder impedance parameter information and power analysis estimates. Additionally, there can also be involved a statistical approach to finding outliers from meter readings spanning multiple days, thus the system can end up being adaptable to seasonal load variations.

The features discussed above, and others, relating to at least one embodiment of the invention, will be better appreciated from the discussion which follows.

Generally, in accordance with at least one embodiment of the invention, it can be understood that availability of smart meters at customer premises provides enormous usage data at various points in a distribution system. In connection with using such data to localize points where electricity theft is occurring, detecting NTL tends to be easy (as shown by the equation below), while localization is difficult:

$$NTL = E_{substn} - \Sigma E_{cust}$$

(Here, $E_{substn}$ and $\Sigma E_{cust}$ represent electric power provided, respectively, from a substation and to all customers served by that substation.)

As such, in accordance with a general background relative to at least one embodiment of the invention, conventional localization techniques use network parameters to estimate voltages expected at different customer premises. Such estimates are then compared with smart meter readings, wherein a significant difference between the measured and estimated values indicates an occurrence of theft. However, such techniques present a variety of problems. For instance, network parameters for a distribution system as provided by the utility companies tend not to be accurate and are seldom easily obtainable. In the event of theft, a difference in the estimated and measured values will be noticeable everywhere in a radial feeder, and correctly determining an exact location of theft becomes very difficult.

In accordance with at least one embodiment of the invention, there is determined a measured voltage difference (e.g., in terms of RMS [root mean square] voltage magnitude) between successive nodes in the radial system. Inasmuch as the voltage readings can be obtained from smart meter readings, it is recognized here that, in the event of theft, the voltage difference between successive nodes in a radial feeder will rise significantly upstream of the theft location. At the same time, downstream of the theft location, the voltage difference will not change significantly. Inasmuch as voltage difference can also be a function of time, as loading conditions change throughout the day, a challenge becomes identifying voltage difference under conditions of theft.

In accordance with at least one embodiment of the invention, FIG. 1 schematically illustrates radial feeders under normal circumstances (101) and in a condition of power theft (103). In this highly simplified example for illustrative purposes, each radial feeder starts with a distribution transformer (towards the top of each diagram), designated as node 1, and distributes to a series of other nodes (2 through 4), each involving a corresponding voltage drop. In this vein, it can be recognized that the cumulative loading condition of a group of customers follows a rough pattern every day. Under normal circumstances, the voltage differences are approximated as follows (where V, I and Z represent voltage, current and impedance, respectively, and subscripts indicate nodes or locations on the radial feeder grid 101, and Re is the "real" portion of the given quantities):

$$(|\bar{V}_1| - |\bar{V}_2|) \approx \mathrm{Re}[(\bar{I}_1 + \bar{I}_2 + \bar{I}_3)Z_{12}]$$

$$(|\bar{V}_2| - |\bar{V}_3|) \approx \mathrm{Re}[(\bar{I}_2 + \bar{I}_3)Z_{23}]$$

$$(|\bar{V}_3| - |\bar{V}_4|) \approx \mathrm{Re}[\bar{I}_3 Z_{23}]$$

Under conditions of illegal loading (theft), however (grid 103):

$$(|\bar{V}_1| - |\bar{V}_2|) \approx \mathrm{Re}[(\bar{I}_1 + \bar{I}_2 + \bar{I}_3 + \bar{I}_{th})Z_{12}]$$

$$(|\bar{V}_2| - |\bar{V}_3|) \approx \mathrm{Re}[(\bar{I}_2 + \bar{I}_3 + \bar{I}_{th})Z_{23}]$$

$$(|\bar{V}_3| - |\bar{V}_4|) \approx \mathrm{Re}[\bar{I}_3 Z_{23}]$$

Thus, in the present example, $(|\bar{V}_1| - |\bar{V}_2|)$ and $(|\bar{V}_2| - |\bar{V}_3|)$ change in view of $\bar{I}_{th}$ (current withdrawn by way of power theft), but $|\bar{V}_3| - |\bar{V}_4|$ remains unchanged. Thus, in this example, node 3 is the probable point where illegal power consumption (voltage/power theft) is taking place.

In accordance with at least one embodiment of the invention, it is recognized that the loading condition at every node varies throughout the day, thus the voltage pattern at each node also will vary accordingly. However, it can also be recognized that the voltage pattern will normally be roughly the same for just about every 24 hour period, albeit with some "noise" included. As broadly contemplated herein, moving averages of node voltages are taken, with respect to windows spanning one hour, and node voltage differences are calculated for every window. If this process is repeated for a significant number of days, then on a day to day basis voltage differences will not tend to change significantly for a given window as long as power theft is not present.

In accordance with at least one embodiment of the invention, it is recognized that if illegal power consumption starts taking place at any particular node, the node voltage differences will increase upstream of that node, while node voltage differences downstream of that node will not change. Accordingly, if it is determined that voltage differences (with respect to a node) are statistically significant from a particular day onward, with respect to a set of reference days, then power theft can be suspected at that node.

Figure 2:
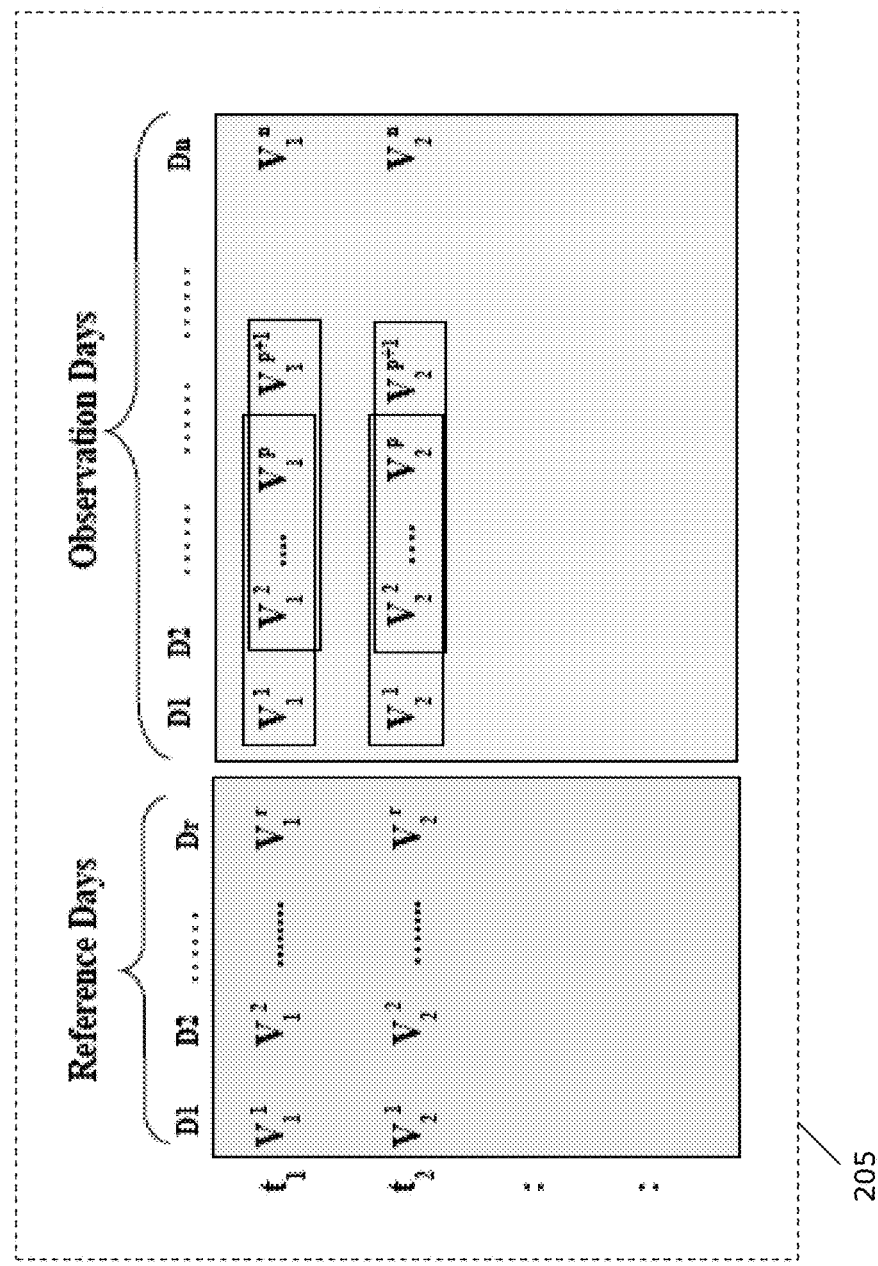
FIG. 2 provides a graphical illustration of measurements taken over given reference days and observation days.

In accordance with at least one embodiment of the invention, in the graphical layout of days and times (205) shown in FIG. 2, V represents the voltage difference in a pair of successive nodes in a radial feeder, taken at different times (subscripts) and on different days (superscripts). Here, a given set of consecutive days is considered to constitute "reference days" (D1, D2, . . . Dr). The reference set could be changed on a monthly/seasonal basis; $t_1, t_2, \ldots$, represent different time spans in a given day. Observation days (D1, D2, . . . Dn) are chosen in the form of a moving window. In FIG. 2, there are r reference days and p observation days, where r>p. Here, the moving windows are shown as smaller rectangles; thus, observations can be taken at the same given time (e.g., $t_1$) on a number of consecutive days p; if the window starts at day 1 (D1), then the window ends once observations have been taken over p days, up to and including day p. On the other hand, if the window starts at day 2 (D2), then the window ends once observations have been taken over p days, up to and including day p+1.

It can be recognized, in accordance with at least one embodiment of the invention, that since power consumption pattern changes with time, reference days and observation days should have identical consumption patterns (for e.g., Monday-Friday, summer days, winter days, etc.). Reference and observation days could thus be selected based on the calculated equivalent load ($L_{eq}$) at the distribution substation, as determined via the following equation, based on values calculated from installed smart meters:

$$L_{eq} = \left[\frac{L_p \cdot t_p + L_{np} \cdot t_{np}}{t_p + t_{np}}\right]^{0.5}$$

In the present example, in accordance with at least one embodiment of the invention, $L_p$ and $L_{np}$ represent the peak and non-peak period loads (in kW/kVA), and $t_p$ and $t_{np}$ (in minutes/hours) their corresponding durations. $L_p$ and $L_{np}$ can be calculated by adding the energy consumption data of all the smart meters. If the variance of $L_{eq}$ for a set of days is below a predetermined threshold, then those days could be examined for locating theft.

Accordingly, in the present example in accordance with at least one embodiment of the invention, let it be considered that the first m days were found to have $L_{eq}$ with variance below the predetermined threshold. The last p days are taken from this set as observation days, and the first r=m−p days are taken as the reference days. While p is fixed in an algorithm beforehand, the bounds on r (upper U and lower L) are: $r<=r_U$ and $r>r_L>p$.

In accordance with at least one embodiment of the invention, if the p observation days are found to be normal (i.e., they show no power theft), then these p observation days, together with the last r−p days from the last reference set, form a new reference set. A new set of p observation days is then created, such that the variance of their $L_{eq}$ is within the (aforementioned) specified threshold. If these p days cannot be found under such conditions, then a predetermined number of days (e.g., 2 or 3) are taken from the reference set and then added to the set of observation days p, at least to the extent of ensuring that the aforementioned conditions (involving variance) are met. The number of reference days, r, will thus decrease. In this scenario, should r go below the lower bound $r_L$, then threshold on the variance of $L_{eq}$ can be readjusted (e.g., increased) in such a manner as to obtain a requisite number of observation days. The sets of reference and observation days are continually updated until such a point that power theft may be located at a node.

Figure 3:
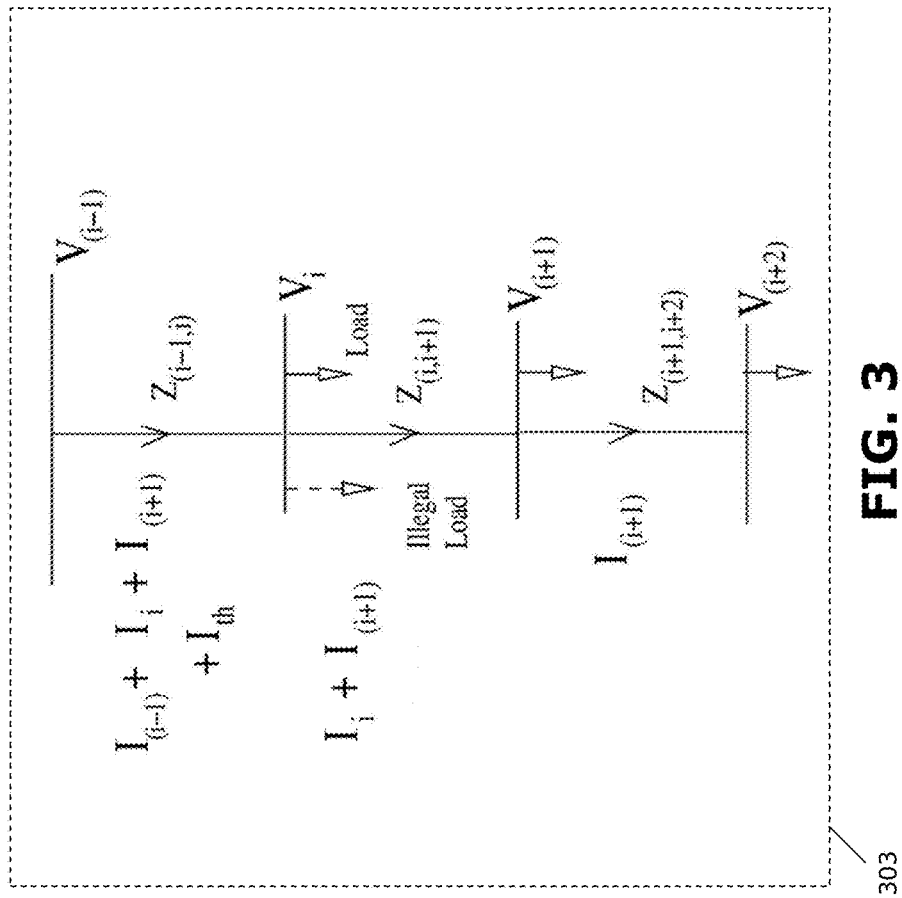
FIG. 3 schematically illustrates a radial feeder for which a double-differencing technique is employed to locate power theft.

In accordance with at least one embodiment of the invention, FIG. 3 schematically illustrates a radial feeder (303) for which a double-differencing technique is employed to locate power theft. Accordingly, it can be appreciated from the figure that:

$$|\bar{V}_{i-1}| - |\bar{V}_i| \approx \text{Re}[(\bar{I}_{i-1} + \bar{I}_i + \bar{I}_{i+1})Z_{i-1,i}] \text{ and}$$

$$|\bar{V}_i| - |\bar{V}_{i+1}| \approx \text{Re}[(\bar{I}_i + \bar{I}_{i+1})Z_{i,i+1}].$$

However, if $Z_{i,i-1} \approx Z_{i,i+1}$, then:

$$(|\bar{V}_{i-1}| - |\bar{V}_i|) - (|\bar{V}_i| - |\bar{V}_{i+1}|) \approx \text{Re}[\bar{I}_{i-1}Z_{i-1,i}].$$

Accordingly, under conditions of power theft at node i:

$$(|\bar{V}_{i-1}| - |\bar{V}_i|) - (|\bar{V}_i| - |\bar{V}_{i+1}|) \approx \text{Re}[(\bar{I}_{i-1} + \bar{I}_{th})Z_{i-1,i}]$$

After double differencing, it can be appreciated that there will no longer be variations in $\bar{I}_i$ and $\bar{I}_{i+1}$ to deal with, thus theft detection becomes much easier.

On the other hand, in accordance with at least one embodiment of the invention, it is recognized that if $Z_{i,i-1} >> Z_{i-1,i}$, then when using a double-differencing technique the effect of $\bar{I}_i$ and $\bar{I}_{i+1}$ could overshadow the effect of $\bar{I}_{th}$. However, this problem can be avoided or mitigated via a normalization procedure now to be described.

As such, in accordance with at least one embodiment of the invention, consider that there are n nodes downstream to the node (node i) being checked. Thus, let $$X_1 \approx \frac{(|\bar{V}_{i-1}| - |\bar{V}_i|)}{\sigma_{i,i+1}},$$

where $\sigma_{i,i+1}$ the standard deviation in $(|\bar{V}_{i-1}| - |\bar{V}_i|)$. Then, $$X_1 \approx \sum_{j=i-1}^{i+n-1} \frac{\text{Re}(\bar{I}_j Z_{i-1,i})}{\sqrt{\text{Var}\left(\sum_{j=i-1}^{i+n-1} \text{Re}(\bar{I}_j Z_{i-1,i})\right)}} = \sum_{j=i-1}^{i+n-1} \frac{|\bar{I}_j|}{\sqrt{\sum_{j=i-1}^{i+n-1} \text{Var}(|\bar{I}_j|)}}.$$

Similarly, $$X_2 \approx \frac{(|\bar{V}_i| - |\bar{V}_{i+1}|)}{\sigma_{i,i+1}} = \sum_{j=i}^{i+n-1} \frac{|\bar{I}_j|}{\sqrt{\sum_{j=i}^{i+n-1} \text{Var}(|\bar{I}_j|)}},$$

when considering $\bar{I}_j$ s to be independent and of almost identical phase. Accordingly, if $|\bar{I}_j|$ s are of the same order and of almost equal variance, it can then be shown for large n that:

$$X_1 - X_2 \approx \frac{1}{2} \frac{|\bar{I}_{i-1}|}{\sqrt{\sum_{j=i}^{i+n-1} \text{Var}(|\bar{I}_j|)}}$$

Clearly, $X_1 - X_2$ is independent of any impedance parameter and is proportional to the magnitude of the current $\bar{I}_{i-1}$ only.

Accordingly, in accordance with at least one embodiment of the invention, the values of $|\bar{V}_{i-1}| - |\bar{V}_i|$ and $|\bar{V}_i| - |\bar{V}_{i+1}|$ are used, wherein $\sigma_{i-1,i}^{ref}$ and $\sigma_{i,i+1}^{ref}$ are to be calculated from measurements over a set of reference days. The values of $X_1 - X_2$ are then calculated as follows:

$$X_1 - X_2 = \frac{(|\overline{V}_{i-1}| - |\overline{V}_i|)}{\sigma_{i-1,i}^{ref}} - \frac{(|\overline{V}_i| - |\overline{V}_{i+1}|)}{\sigma_{i,i+1}^{ref}}$$

As such, if there is theft at node i, $X_1$-$X_2$ under the above assumptions would be:

$$X_1 - X_2 = \frac{1}{2} \frac{|\bar{I}_{i-1}|}{\sqrt{\sum_{j=i}^{i+n-1} \text{Var}(|\bar{I}_j|)}} + \frac{|\bar{I}_{th}|}{\sqrt{\sum_{j=i-1}^{i+n-1} \text{Var}(|\bar{I}_j|)}}$$

A statistical distance measure of $X_1$-$X_2$ with respect to the reference set of days would then permit a determination of the probability of power theft at node i.

It can be appreciated from the foregoing that, in accordance with at least one embodiment of invention, a technical improvement is represented at least via provision of a capability for calculating voltage differences from smart meter readings in a manner to locate a probable point of power theft, whereby, in using solely using voltage readings, a resultant theft detection system can be independent of feeder impedance parameter information and power analysis estimates.

In accordance with at least one embodiment of the invention, very generally, quantitative values as determined herein, or other data or information as used or created herein, can be stored in memory or displayed to a user on a screen, as might fit the needs of one or more users.

Figure 4:
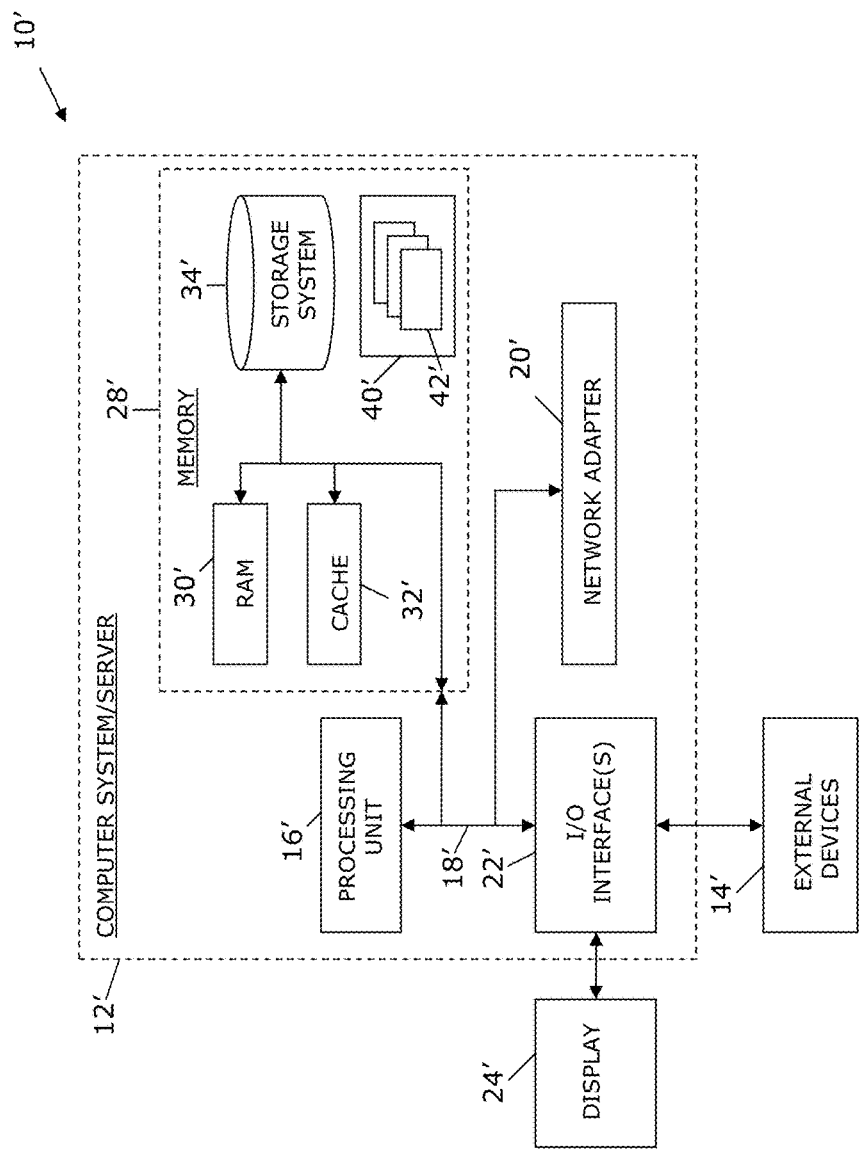
FIG. 4 illustrates a computer system.

Referring now to FIG. 4, a schematic of an example of a computing node is shown. Computing node 10' is only one example of a suitable computing node and is not intended to suggest any limitation as to the scope of use or functionality of embodiments of the invention described herein. Regardless, computing node 10' is capable of being implemented and/or performing any of the functionality set forth hereinabove. In accordance with embodiments of the invention, computing node 10' may be part of a cloud network or could be part of another type of distributed or other network (e.g., it could represent an enterprise server), or could represent a stand-alone node.

In computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 12' in computing node 10' is shown in the form of a general-purpose computing device. The components of computer system/server 12' may include, but are not limited to, at least one processor or processing unit 16', a system memory 28', and a bus 18' that couples various system components including system memory 28' to processor 16'. Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12'; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
calculating load equivalences at a distribution substation of a branch of an electric distribution grid;
determining a period of time when consecutive load equivalences at the distribution substation of the branch of the electrical distribution grid are less than a predetermined threshold, the period of time comprises a set of consecutive observation days and a set of consecutive reference days;
receiving a plurality of node voltage measurements from a set of nodes "n" of the branch of the electrical distribution grid over the period of time;
for each node of the set of nodes "n" that are downstream of a first node of the set of nodes "n" and upstream of a last node of the set of nodes "n", the first node being upstream of all other nodes of the set of nodes "n" in the branch of the electrical distribution grid and the last node being downstream of all other nodes of the set of nodes "n", determine a difference between X1 and X2, X1 representing a first difference between an average voltage at an upstream node that is immediately upstream of that particular node during the set of consecutive observation days and an average voltage at that particular node during the set of consecutive observation days, the first difference being divided by $\sigma_{(i-1,\ i)}$, $\sigma_{(i-1,\ i)}$ being the standard deviation of the difference between the average voltage at the upstream of that particular node during the set of consecutive reference days, and the average voltage at that particular node during the set of consecutive reference days, X2 represents a second difference between the average voltage at that particular node during the set of consecutive observation days, and an average voltage at a downstream node that is immediately downstream of that particular node during the set of consecutive observation days, the second difference being divided by $\sigma_{i,\ i+1}$, $\sigma_{i,\ i+1}$ being the standard deviation of the difference between the average voltage that particular node during the set of consecutive reference days and the average at the downstream that is immediately downstream of that particular node during the set of consecutive reference days; and
evaluating the difference between X1 and X2 for each node in the set of nodes "n" other than the first node and the last node against a power theft threshold to determine, for each node other than the first node and the last node if there is possible power theft during the set of consecutive observation days.

2. The method according to claim 1, wherein the number of consecutive observation days is less than the number of consecutive reference days.

3. The method according to claim 2, wherein said set of consecutive observation days comprises a moving window of one or more consecutive days within the set of consecutive reference days.

4. The method according to claim 1, wherein if the difference between X1 and X2 does not satisfy the power theft threshold, increase the set of consecutive observation days by taking a predetermined number of days from the set of consecutive reference days and add the predetermined number of days to the set of consecutive observation days.

5. The method according to claim 4 further comprising, re-calculating load equivalences at the distribution substation of the branch of the electric distribution grid if the number of reference days falls below a lower reference days bound.

6. The method according to claim 1, wherein the set of consecutive reference days is changed on a monthly or seasonal basis.

7. An apparatus comprising:
at least one processor; and
a computer readable storage medium having computer readable program code embodied therewith and executable by the at least one processor, the computer readable program code comprising:
computer readable program code that calculates load equivalences at a distribution substation of a branch of an electrical distribution grid;
computer readable program code that determines a period of time when consecutive load equivalences at the distribution substation of the branch of the electrical distribution grid are less than a predetermined threshold, the period of time comprises a set of consecutive observation days and a set of consecutive reference days;
computer readable program code that receives a plurality of node voltage measurements from a set of nodes "n" of the branch of the electrical distribution grid over the period of time;
computer readable program code that determines a difference between X1 and X2 for each node of the set of nodes "n" that are downstream of a first node of the set of nodes "n" and upstream of a last node of the set of nodes "n", the first node being upstream of all other nodes of the set of nodes "n" in the branch of the electrical distribution grid and the last node being downstream of all other nodes of the set of nodes "n", X1 represents a first difference between an average voltage at an upstream node that is immediately upstream of that particular node during the set of consecutive observation days and an average voltage at that particular node during the set of consecutive observation days, the first difference being divided by $\sigma_{(i-1,\ i)}$, $\sigma_{(i-1,\ i)}$ being the standard deviation of the difference between the average voltage at the upstream of that particular node during the set of consecutive reference days, and the average voltage at that particular node during the set of consecutive reference days, X2 represents a second difference between the average voltage at that particular node during the set of consecutive observation days, and an average voltage at a downstream node that is immediately downstream of that particular node during the set of consecutive observation days, the second difference being divided by $\sigma_{i,\ i+1}$, $\sigma_{i,\ i+1}$ being the standard deviation of the difference between the average voltage that particular node during the set of consecutive reference days and the average at the downstream that is immediately downstream of that particular node during the set of consecutive reference days; and computer readable program code that evaluates the difference between X1 and X2 for each node in the set of nodes "n" other than the first node and the last node against a power theft threshold to determine, for each node other than the first node and the last node if there is possible power theft.

8. A computer program product comprising:

a computer readable storage medium having computer readable program code embodied therewith, the computer readable program code comprising:

computer readable program code that calculates load equivalences at a distribution substation of a branch of an electrical distribution grid;

computer readable program code that determines a period of time when consecutive load equivalences at the distribution substation of the branch of the electrical distribution grid are less than a predetermined threshold, the period of time comprises a set of consecutive observation days and a set of consecutive reference days;

computer readable program code that receives a plurality of node voltage measurements from a set of nodes "n" of the branch of the electrical distribution grid over the period of time;

computer readable program code that determines a difference between X1 and X2 for each node of the set of nodes "n" that are downstream of a first node of the set of nodes "n" and upstream of a last node of the set of nodes "n", the first node being upstream of all other nodes of the set of nodes "n" in the branch of the electrical distribution grid and the last node being downstream of all other nodes of the set of nodes "n", X1 represents a first difference between an average voltage at an upstream node that is immediately upstream of that particular node during the set of consecutive observation days and an average voltage at that particular node during the set of consecutive observation days, the first difference being divided by $\sigma_{(i-1, i)}$, $\sigma_{(i-1, i)}$ being the standard deviation of the difference between the average voltage at the upstream of that particular node during the set of consecutive reference days, and the average voltage at that particular node during the set of consecutive reference days, X2 represents a second difference between the average voltage at that particular node during the set of consecutive observation days, and an average voltage at a downstream node that is immediately downstream of that particular node during the set of consecutive observation days, the second difference being divided by $\sigma_{i, i+1}$, $\sigma_{i, i+1}$ being the standard deviation of the difference between the average voltage that particular node during the set of consecutive reference days and the average at the downstream that is immediately downstream of that particular node during the set of consecutive reference days; and computer readable program code that evaluates the difference between X1 and X2 for each node in the set of nodes "n" other than the first node and the last node against a power theft threshold to determine, for each node other than the first node and the last node if there is possible power theft.

9. The computer program product according to claim 8, the number of consecutive observation days is less than the number of consecutive reference days.

10. The computer program product according to claim 9, wherein the said set of consecutive observation days comprises a moving window of one or more consecutive days within the set of consecutive reference days.

11. The computer program product according to claim 8, wherein if the difference between X1 and X2 does not satisfy the power theft threshold, increase the set of consecutive observation days by taking a predetermined number of days from the set of consecutive reference days and add the predetermined number of days to the set of consecutive observation days.

12. The computer program product according to claim 11 further comprising, re-calculating load equivalences at the distribution substation of the branch of the electric distribution grid if the number of reference days falls below a lower reference days bound.

13. The computer program product according to claim 8, wherein the set of consecutive reference days is changed on a monthly or seasonal basis.

* * * * *